United States Patent
Lee

(10) Patent No.: US 11,783,881 B2
(45) Date of Patent: Oct. 10, 2023

(54) APPARATUSES, SYSTEMS, AND METHODS FOR DIRECT REFRESH MANAGEMENT COMMANDS

(71) Applicant: MICRON TECHNOLOGY, INC., Boise, ID (US)

(72) Inventor: Joo-Sang Lee, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 17/666,302

(22) Filed: Feb. 7, 2022

(65) Prior Publication Data

US 2023/0253023 A1    Aug. 10, 2023

(51) Int. Cl.
  *G11C 11/406*    (2006.01)
  *G11C 11/408*    (2006.01)

(52) U.S. Cl.
  CPC ........ *G11C 11/406* (2013.01); *G11C 11/4087* (2013.01)

(58) Field of Classification Search
  CPC .................. G11C 11/406; G11C 11/4087
  USPC .......................................... 365/222
  See application file for complete search history.

(56) References Cited

U.S. PATENT DOCUMENTS

| 2022/0293162 A1* | 9/2022 | Nale ................. G11C 11/40611 |
| 2023/0141789 A1* | 5/2023 | Cho .................. G11C 11/40622 |
|  |  | 365/222 |

OTHER PUBLICATIONS

U.S. Appl. No. 17/695,568, titled "Apparatuses, Systems, and Methods for Direct Refresh Management Sampling Protection", filed Mar. 15, 2022; pp. all pages of application as filed.

* cited by examiner

*Primary Examiner* — Connie C Yoha
(74) *Attorney, Agent, or Firm* — Dorsey & Whitney LLP

(57) ABSTRACT

Apparatuses, systems, and methods for direct refresh management (DRFM) commands. A controller provides a DRFM command to a memory along with a row address. A command decoder of the memory provides an activate command and then a pre-charge command along a signal line to a bank. During a tRP time after the pre-charge command before a next activate command, a DRFM sampling command is provided along the signal line which causes the address to be latched in a DRFM latch. Responsive to a later DRFM service command, one or more wordlines based on the address in the DRFM latch are refreshed.

20 Claims, 6 Drawing Sheets

APPARATUSES, SYSTEMS, AND METHODS FOR DIRECT REFRESH MANAGEMENT COMMANDS

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

Different memory cells may lose information at different rates (e.g., different rates of memory decay). The memory may perform CBR operations by refreshing the wordlines in a sequence such that each word line is refreshed faster than the anticipated rate of information decay. Certain situations, such as certain access patterns, may cause an increased rate of data decay. To account for this, the memory and/or a controller of the memory may identify row addresses which should be refreshed out of sequence as part of a targeted refresh operation.

DETAILED DESCRIPTION

Figure 1:
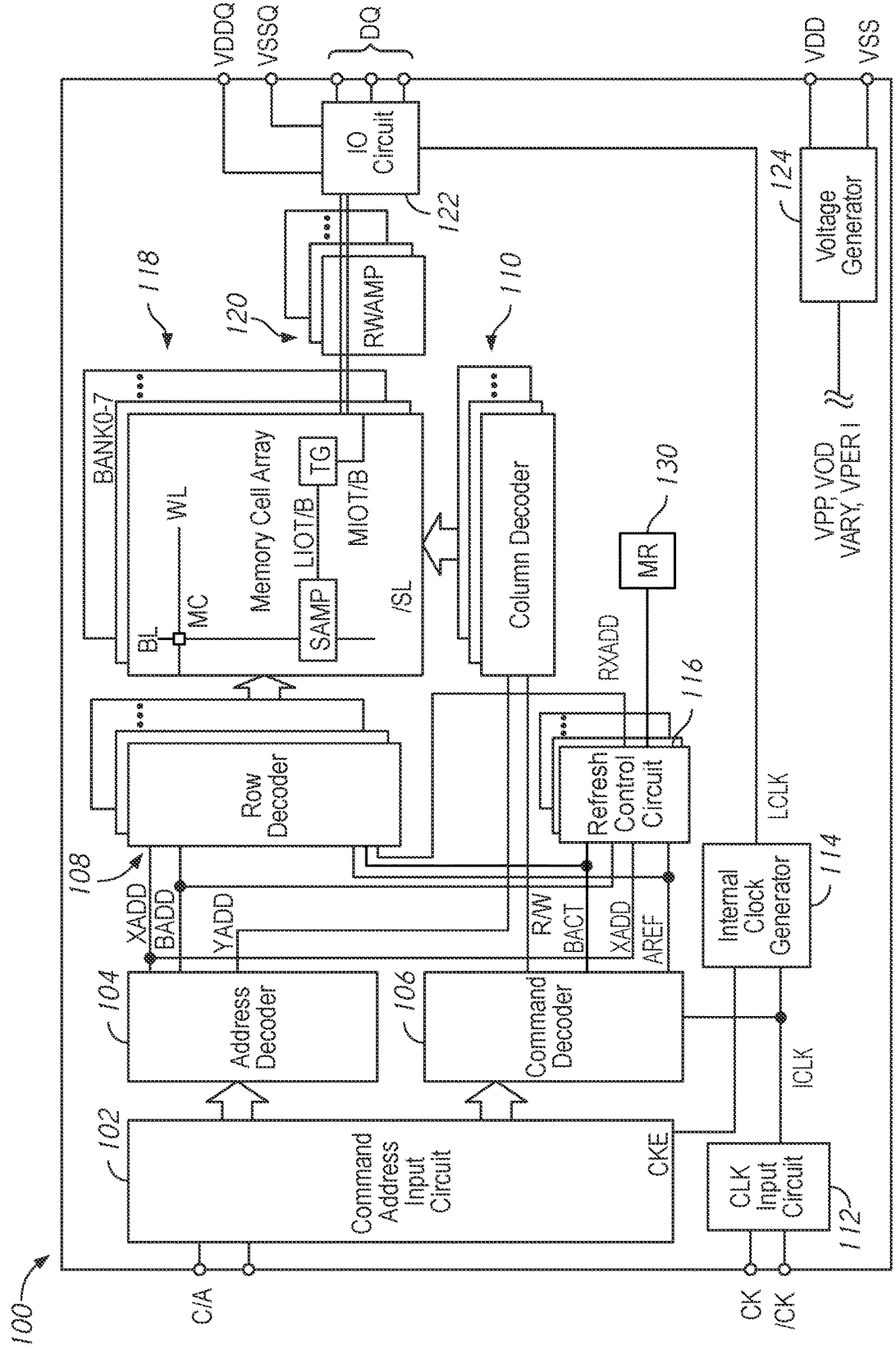
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (wordlines) and columns (bit lines), in each bank of a memory array. The memory cells may be refreshed on a row-by-row basis. In order to prevent information from being lost or corrupted due to this decay, the memory may carry out refresh operations, such as auto-refresh or self-refresh operations, which may perform a sequence of CBR refreshes. During a refresh operation, information may be rewritten to memory cells associated with the wordline to restore their initial states. The CBR operations may be performed on the wordlines of the memory in a sequence such that over a refresh cycle all word lines are refreshed.

The rate at which the refresh operations are performed may be chosen to prevent the loss of information, ideally such that each memory cell is refreshed before the information stored in that memory cell is lost. The rate at which the refresh cycle is performed may be based on an expected fastest rate of information decay. However, certain access patterns to rows of the memory (aggressor rows or aggressor word lines) may cause an increased rate of decay in the memory cells along nearby rows (victim rows or victim word lines). It may thus be important to identify these aggressor rows so that their associated victims may be refreshed as part of a targeted refresh operation outside of the normal CBR sequence.

The memory may include logic which controls the timing of targeted refresh operations. For example, the memory may perform some number of targeted refresh operations every $N^{th}$ CBR operations. The memory may also perform a targeted refresh operation when commanded to by a controller as part of a refresh management (RFM) command. For example, the memory may receive an RFM command and perform one or more targeted refresh operations based on aggressors that the memory has identified. The memory may also receive a direct RFM (DRFM) command, which both specifies that the memory should perform a targeted refresh operation, and also specifies the aggressor address and the range of victim word lines which should be refreshed as part of the targeted refresh operation. There may be a need to manage the manner in which DRFM commands are supplied to and processed by the memory to cut down on the number of signal lines in the memory.

The present disclosure is drawn to direct refresh management commands. The DRFM operation may include multiple commands. For example a DRFM sampling command may indicate that a row address provided by the controller is an aggressor and should be stored in a DRFM register of a bank associated that address. A DRFM service command may cause the memory to refresh one or more victims associated with the address in the DRFM register. A mode register setting may instruct the memory how many word lines (and what relationship with the aggressor) to refresh. The controller may provide these command individually or may provide a single DRFM command and the memory may internally generate the DRFM sampling and service commands. The DRFM sampling command may leverage existing signal lines within the memory rather than requiring global signal lines.

Each bank may receive signals from a command decoder which operate the bank. For example, the command decoder may provide an activation command to activate a bank (e.g., for an access operation) and then a pre-charge command to de-activate the bank. Between the pre-charge command and a next access command there may be a row pre-charge time tRP which is mandated by a specification of the memory.

Since no subsequent activate command to that bank can arrive during tRP, a DRFM sampling command instructing the memory to store an address may be inserted during tRP, and may share signal lines used for activation and/or pre-charge commands. For example, the memory includes a command decoder which provides bank activation signals to each of the banks, each along a respective bank activation signal line. The bank activation signal has a rising edge which indicates an activation, and a falling edge which indicates a pre-charge. A pulse along the bank activation signal line (after the falling edge and during the tRP period) indicates a DRFM sampling command. In this way, the DRFM sampling command may be provided along the bank activation signal lines.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. For example, memories may include 4, 16, 32 more or fewer banks. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder 108 and the selection of the bit lines BL and/BL is performed by a column decoder 110. In the embodiment of FIG. 1, the row decoder 108 includes a respective row decoder for each memory bank and the column decoder 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (C/A) terminals coupled to a command and address bus to receive commands and addresses, and a CS signal, clock terminals to receive clocks CK and /CK, data terminals DQ to provide data, and power supply terminals to receive power supply potentials VDD, VSS, VDDQ, and VSSQ. The external terminals may be coupled to a controller (not shown in FIG. 1) which may operate the memory by providing various signals to the external terminals.

The clock terminals are supplied with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The C/A terminals may be supplied with commands. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line. The command decoder 106 also provides bank activation signals BACT to each of the banks of the memory array 118. The bank activation signals may be used to convey activation and pre-charge signals to the banks. For example, a rising edge of BACT may indicate an activation command and a falling edge of BACT may indicate a pre-charge command. Other waveforms of BACT may be used to indicate activation and pre-charge commands in other example embodiments.

The device 100 may receive commands and addresses as part of an access operation such as a read operation. As part of the access operation, a row address and bank address received along with an activate command. As part of the access operation, a column address and bank address are received along with a read command. Responsive to the read operation, read data is read from memory cells in the memory array 118 corresponding to the row address and column address. The commands associated with the read operation are received by the command decoder 106, which provides internal commands so that read data from the memory array 118 is provided to the read/write amplifiers 120. Responsive to the activate command the row decoder 108 activates a word line associated with the row address. For example a rising edge of the signal BACT is provided to that bank, which causes the memory array to activate the row indicated by the row decoder 108. While the row is active, memory cells along that row are coupled to sense amplifiers activated by the column decoder 110 responsive to the read command to read data out along the LIOT/B lines. The read data is output to outside from the data terminals DQ via the input/output circuit 122. The command decoder 106 may then provide a falling edge of the signal BACT as a pre-charge command which may 'close' the active row.

The device 100 may receive commands and addresses as part of an access operation such as a write operation. As part of the write operation, a row address and bank address are received along with an activated command and a column address and bank address are received along with write data and a write command. Responsive to the write operation, write data supplied to the data terminals DQ is written to a memory cells in the memory array 118 corresponding to the row address and column address. The commands associated with the write operation are received by the command decoder 106, which provides internal commands so that the write data is received by data receivers in the input/output circuit 122. Responsive to the activate command the row decoder 108 activates a word line associated with the row address. For example a rising edge of the signal BACT is provided to that bank, which causes the memory array to activate the row indicated by the row decoder 108. While the row is active, memory cells along that row are coupled to sense amplifiers activated by the column decoder 110 responsive to the write command to receive write data. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. The command decoder 106 may then provide a falling edge of the signal BACT as a pre-charge command which may 'close' the active row.

The device 100 may also perform refresh operations, such as CBR refresh operations. The CBR refresh operations may be performed as part of an auto-refresh operation, where a controller issues an auto-refresh command or as part of a self-refresh operation, where the memory refreshes itself based on internal commands. For example, in some embodiments, the auto-refresh mode command may be externally issued to the memory device 100. In some embodiments, the self-refresh mode command may be periodically generated by a component of the device. Whether responsive to an external command (e.g., auto-refresh) or internal logic (e.g., self-refresh) a refresh signal is used to control timing of refresh operations. For the sake of brevity, a single refresh signal AREF is described herein, however in some embodiments separate signals may be used for auto- and self-refresh.

The refresh signal AREF is supplied to the refresh control circuit 116. The refresh control circuit 116 supplies a refresh row address RXADD to the row decoder 108, which may refresh one or more wordlines WL indicated by the refresh row address RXADD. In some embodiments, the refresh address RXADD may represent a single wordline. In some embodiments, the refresh address RXADD may represent multiple wordlines, which may be refreshed sequentially or simultaneously by the row decoder 108. In some embodiments, the number of wordlines represented by the refresh address RXADD may vary from one refresh address to another. The refresh control circuit 116 may be controlled to change details of the refreshing address RXADD (e.g., how the refresh address is calculated, the timing of the refresh addresses, the number of wordlines represented by the address), or may operate based on internal logic.

The refresh control circuit 116 may selectively output a targeted refresh address (e.g., which specifies one or more victim address based on an aggressor) or an automatic refresh address (e.g., from a sequence of CBR addresses) as the refresh address RXADD. Based on the type of refresh address RXADD (and in some embodiments, one more additional signals indicating the type of operation), the row decoder 108 may perform a targeted refresh or CBR operation. The automatic refresh addresses may be from a sequence of addresses such that over a cycle of the sequence, all of the word lines are refreshed. For example, a counter circuit may be used to increment or otherwise 'count through' possible row address values for RXADD. The refresh control circuit 116 may cycle through the sequence of CBR addresses at a rate determined by AREF. A refresh cycle may represent the CBR address generator refreshing each row of the memory (e.g., providing each value of the CBR address). In some embodiments, the CBR operations may generally occur with a timing such that the sequence of CBR addresses is cycled such that no information is expected to degrade in the time between CBR operations for a given wordline. In other words, CBR operations may be performed such that each wordline is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address RXADD. For example, the refresh address RXADD may be a calculated based on the row addresses XADD provided by the address decoder.

The refresh control circuit 116 includes an aggressor detector circuit which monitors the row addresses XADD provided as part of access operations to determine which rows are aggressors. Those identified aggressors may be used to determine the refresh addresses RXADD used in targeted refresh operations. For example, if an address XADD is identified as an aggressor, then the victim addresses issued as RXADD may include XADD+1, XADD−1 (e.g., the physically adjacent word lines), XADD+2, XADD−2, and/or other word lines which are near to the word line associated with XADD.

The refresh control circuit 116 includes internal logic which determines when to perform a targeted refresh operation. For example, each time AREF is received, the refresh control circuit may generate a number of 'refresh pumps' each associated with a refresh operation. For example, after receiving AREF, the refresh control circuit 116 may provide four pumps (e.g., four refresh addresses RXADD). More or fewer pumps per AREF may be used in other examples. In some examples the number of pumps per AREF may vary. The pumps may each specify an CBR or targeted refresh operations. In some embodiments, each pump group (e.g., the set of pumps produced responsive to an AREF) may include a mix of targeted and CBR operations. In some embodiments, each pump group may include refresh operations of one type or the other. In some embodiments, the refresh control circuit 116 may perform a set of targeted refresh operations after performing some number of CBR operations.

The memory device 100 may receive a refresh management RFM command at the C/A terminals. The RFM command may instruct the memory device 100 to perform a targeted refresh command even if one was not otherwise called for. For example the memory 100 may immediately perform a targeted refresh operation, or may perform a targeted refresh operation as a next refresh operation, even if that refresh would otherwise have been an CBR. Responsive to the RFM command, the refresh control circuit 116 may select the aggressor word line (e.g., from a queue of identified aggressors) and victims to refresh.

The memory device 100 may receive direct refresh management DRFM commands (e.g., a DRFM sampling command and a DRFM service command) at the C/A terminals. The DRFM commands may instruct the memory device 100 to perform a targeted refresh command, similar to the RFM command, but unlike the RFM command, the DRFM commands also specify an aggressor word line to use to calculate the refresh addresses RXADD, and also how those refresh addresses should be calculated. For example, as part of an access operation the memory 100 may receive a bank address BADD, row address XADD and activate command at the C/A terminals and then may subsequently receive the DRFM sampling command along with a pre-charge command (or a command which causes the memory to automatically generate a pre-charge command) at the C/A terminals. The command decoder 106 may issue a DRFM sampling command along a signal line associated with the bank specified by BADD, such as along the BACT signal line. Responsive to the DRFM sampling command, the refresh control circuit 116 associated with that bank may store the row address RXADD in a DRFM latch of the refresh control circuit 116. A mode register 130 includes settings which specify how many and what type of victims should be refreshed as part of a DRFM command. For example, the mode register 130 may specify +/−1, +/−2, +/−3, +/−4, +/−5, +/−6 or combinations thereof. Other victims (e.g., further than +/−6) may also be specified in some embodiments. Responsive to a DRFM service command, the refresh control circuit 116 may begin issuing refresh addresses RXADD based on the address stored in the DRFM latch and determined by the mode register 130 setting.

In some embodiments, the memory device 100 may only respond to RFM and/or DRFM commands if those features are enabled in the mode register 130. For example, unless an RFM enable signal in the mode register 130 is active, then the memory 100 may not respond to a received RFM command. Similarly, unless a DRFM enable signal in the mode register 130 is active, then the memory 100 may not respond to a received DRFM command.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
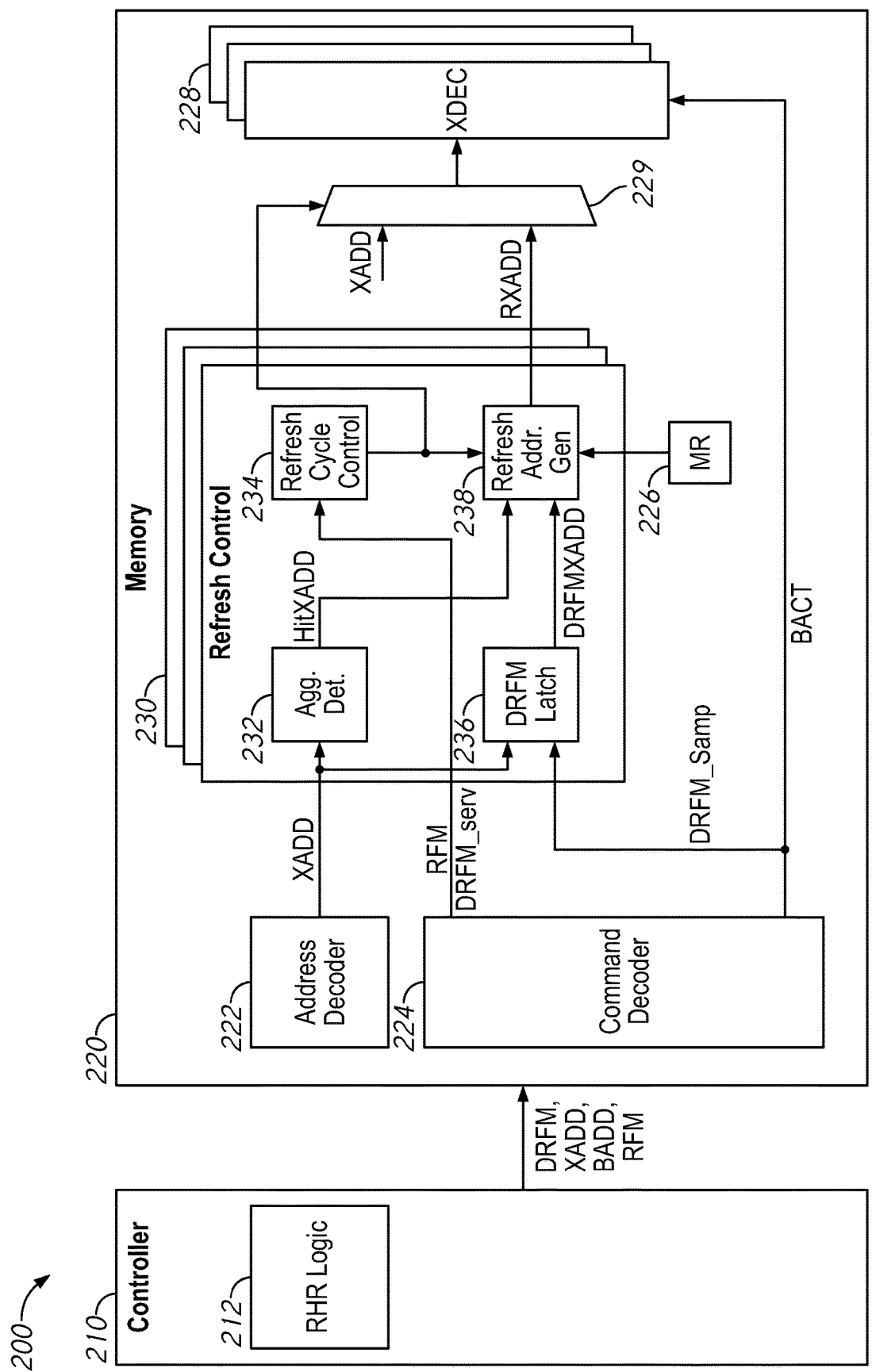
FIG. 2 is a block diagram of a memory system according to some embodiments of the present disclosure.

FIG. 2 is a block diagram of a memory system according to some embodiments of the present disclosure. The system 200 includes a controller 210 and a memory 220. The memory 220 may, in some embodiments, represent the memory device 100 of FIG. 1. The memory 220 shows a simplified view of components relevant to refresh operations. Some components and signals may be omitted for clarity.

The controller 210 is coupled to the memory 220 by various command/address (C/A) signal lines. Row hammer logic 212 of the controller 210 may provide an address XADD and a DRFM command along the C/A lines to the memory 220. The memory 220 includes an address decoder 222 and command decoder 224 which process the addresses and commands respectively. A refresh control circuit 230 of the memory 220 provides a refresh address RXADD as part of a refresh operation. The refresh control circuit 230 includes an aggressor detector 232, which locates and stores aggressor addresses HitXADD based on the access patterns to row addresses XADD. A refresh cycle control circuit 234 determines a type of refresh operation, and instructions a refresh address generator 238 to generate the refresh addresses RXADD based on internal logic for an CBR operation or based on an address HitXADD from the aggressor detector 232 for a targeted refresh operation. The refresh control 230 also includes a DRFM latch 236 which stores an address XADD as a DRFM address DRFMXADD based on a DRFM sampling command DRFM_samp provided by the command decoder 224 along a BACT signal line. Responsive to a DRFM service command, the refresh cycle control 234 instructs the refresh address generator 238 to generate the addresses RXADD based on DRFMXADD and settings in a mode register 226. A multiplexer 229 provides either the original row address XADD (if no refresh operation is called for) or the refresh address RXADD (if the refresh control circuit 234 indicates that a refresh operation is called for) to a row decoder 228. The row decoder 228 then refreshes word lines based on the refresh address(es) RXADD or accesses the row address XADD.

The controller 210 operates the memory 220, for example by providing commands and addresses along CA signal lines to CA terminals of the memory 220. The controller may provide addresses, such as row addresses XADD, along with commands which cause the memory to perform various operations on the memory cells specified by the addresses. For example the controller may be a processor associated with the memory 220.

The controller 210 includes row hammer logic 212 which identifies aggressor addresses and determines if they should be refreshed as part of a DRFM operation or not. For example, the row hammer logic 212 may monitor addresses XADD which are provided to the memory 220. If a given address is provided a certain number of times and/or above a certain frequency, it may be identified as an aggressor. For example, the row hammer logic 212 may count a number of times that addresses are provided and identify the address as an aggressor if the count exceeds a threshold.

If the row hammer logic 212 determines that a DRFM operation is called for, it may provide a DRFM sampling command and a DRFM service command along a C/A bus to the memory 220 along with the identified aggressor address XADD and its bank address BADD. For example, the controller 210 may provide the row address XADD and bank address BADD along with an activate command. After that the controller 210 may provide an access command (e.g., read or write) along with a column address YADD and the bank address BADD and a pre-charge command along with a DRFM sampling command. In some embodiments, the access command may include an auto pre-charge command and a separate pre-charge command may not be needed. At a later time the controller 210 may provide the DRFM service command.

The memory includes an address decoder which receives the address XADD and BADD and provides them to various components such as to refresh control circuit 230 and row decoders 228. There may be a row decoder 228 and refresh control circuit 230 for each bank, and the bank address BADD determines which row decoder 228 and refresh control circuit 230 receives the address XADD. A command decoder 224 receives commands from the controller 210, such as the DRFM command.

The aggressor address XADD and DRFM sampling command may be supplied to the memory 220 as part of an access operation on the address XADD. The memory 220 may receive the row address XADD and an activate command at a first time, and may receive the DRFM sampling command and a pre-charge command (or access command with an auto-pre-charge) at a second time. For example, the memory may receive a pre-charge per-bank command which specifies a bank address to activate. Other commands such as write, read, or write pattern commands provided along with the column address YADD, may include auto-pre-charge commands which cause the command decoder to automatically generate a pre-charge command. The pre-charge command (or auto-pre-charge access command) may be provided along C/A signal lines to the C/A terminals (e.g., C/A pins) of the memory 220. In some embodiments, one C/A pin may be set aside to indicate if a DRFM sampling command is included.

Based on the access commands, the command decoder 224 provides internal signals such as an activate command (which may open or activate a word line) and a pre-charge command (which may close or pre-charge the word line). In the embodiment of FIG. 2, a signal line BACT is used for both the activate and pre-charge commands, with a rising edge of BACT indicating an activate command and a falling edge of BACT indicating a pre-charge command. There may be a BACT signal line for each bank and which BACT signal line is used may be determined by the bank address BADD. For each bank, a specification of the memory 220 may require a time tRP after a pre-charge command before the next activate command can be issued. In other words, after each falling edge of a given signal line BACT, the time tRP must elapse before a rising edge of that signal line can be used to indicate an activate command to that bank.

The command decoder may use the signal line BACT to provide the DRFM sampling command DRFM_samp to bank logic associated with the bank specified by BADD. When the activate command is received along with the DRFM sampling command, the command decoder provides an active signal (e.g., a voltage which represents a high logical level) along the BACT signal line associated with that bank to indicate that activated command. When the pre-charge command is received (or automatically generated), the command decoder provides an inactive signal (e.g., a voltage which represents a low logical level) to indicate a pre-charge command. During the tRP period for that bank (after the pre-charge command but before the next activate command can be provided), the command decoder provides a DRFM sampling command DRFM_samp along the BACT signal line. For example, the DRFM sampling command DRFM_samp may be a pulse on the BACT signal line during the tRP window. Responsive to the DRFM sampling command, a DRFM latch 236 of the refresh control circuit 230 for that bank latches the address XADD from an address bus of the memory.

The refresh control circuit 230 includes an aggressor detector 232 which detects aggressor addresses based on the addresses XADD along the address bus. The aggressor detector 232 may use similar criteria to the row hammer logic 212, such as a number of accesses and/or a frequency of accesses to a given address. However, the aggressor detector logic 232 may be independent, and may have different criteria. For example, the aggressor detector 232 may use a different threshold for detecting aggressors than the row hammer logic 212.

The refresh control circuit 230 includes a refresh cycle control circuit 234 which determines a timing and type of refresh operation. For example, the refresh cycle control circuit 234 receives a refresh signal AREF, and generates a set of 'pumps' each associated with a refresh operation. The refresh operations may be CBR operations or targeted refresh operations. The refresh cycle control circuit 234 may provide internal signals for each pump to a refresh address generator 238. Based on the type of refresh operation, the refresh address generator 238 provides a refresh address RXADD. For example, if the pump is an CBR operation, then the refresh address RXADD may be generated from a sequence of addresses. For example, the refresh address generator 238 may include a counter which increments a current address generate a next refresh address RXADD in the sequence. When the refresh address RXADD is part of an CBR operation (e.g., an CBR address), the address may be associated with multiple word lines. For example, the address RXADD may be truncated, and all word lines which have an address which shares the non-truncated portion in common may be refreshed by the row decoder 228.

When the refresh cycle controller 234 calls for a targeted refresh operation, the refresh address generator 238 generates the refresh address RXADD based on an identified aggressor HitXADD from the aggressor detector 232. For example, the aggressor detector 232 may include a register of identified aggressors and provide them to the refresh address generator 238. The refresh address generator 238 may generate refresh addresses RXADD for victim word lines associated with the aggressor HitXADD. Each aggressor HitXADD may be used to generate multiple refresh addresses RXADD. For example, refresh addresses RXADD may be generated for HitXADD+1 and HitXADD−1 (e.g., the adjacent word lines). Other numbers of victims and relationships between the victims may be used (e.g., HitXADD+/−1, +/−2, +/−3, etc.).

The refresh cycle control 234 may use various criteria to determine which refresh operations to perform. For example, each time the refresh signal AREF is received, the refresh cycle control circuit 234 may generate four pump signals, each associated with a refresh operation. After a number of CBR operations are performed, a number of targeted refresh operations are called for. Other patterns of CBR and targeted refresh operations may be used in other embodiments. In some embodiments, the refresh cycle control circuit 234 may use various criteria to alter the rate of auto- and targeted refresh operations.

The controller 210 may provide a refresh management signal RFM. Responsive to the RFM signal, the refresh cycle control circuit 234 may provide a set of targeted refresh pumps to the refresh address generator 238, even if refresh operations were not otherwise called for. The RFM command may cause the refresh control circuit 230 to refresh aggressors identified by the aggressor detector 232.

In contrast, responsive to the DRFM command, the refresh control circuit 230 refreshes an address provided by the controller 210. The command decoder 224 generates a DRFM sampling command DRFM_samp which causes the address XADD to be stored in a DRFM latch 236. At some point after providing the DRFM sampling command DRFM_samp, the command decoder 224 also provides a DRFM service command DRFM_serv. Similar to an RFM command, responsive to the DRFM_serv command, the refresh cycle control circuit 234 may provide one or more targeted refresh pumps, even if refresh operations were not otherwise called for. Refresh addresses are generated based on the address DRFMXADD stored in the DRFM latch 236.

A number and type of pumps generated and addresses refreshed may be determined based on a setting in a mode register 226. For example, the mode register 226 may call for 8 refresh addresses RXADD to be generated from DRFMXADD (e.g., DRFMXADD+/−1, +/−2, +/−3, +/−4). The settings of the mode register 226 may change how the refresh addresses are calculated as well as how many pumps are provided from the refresh cycle control 234 responsive to the DRFM_serv command. For example, if the mode register 226 calls for addresses up to +/−2, then four pumps are called for. If the mode register 226 calls for addresses up to +/−6, then 12 pumps are called for. In some embodiments, the mode register 226 may specify a maximum distance from the aggressor that should be refreshed (e.g., up to +/−N word lines away). In some embodiments, the mode register 226 may have more granular settings for selecting which word lines are refreshed.

In some embodiments, the bank logic may also include fuse logic which determines if the row address XADD has been repaired, and if so redirects the row decoder 228 to access a redundant word line instead of the original word line associated with the row address. In some embodiments, the refresh address generator 238 may take redundancy information into account to ensure that during a targeted refresh operation, the victim addresses 238 are associated with word lines which have a spatial relationship (e.g., physically adjacent, 2 away, 3 away, etc.) from the word line associated with the address XADD.

Figure 3:
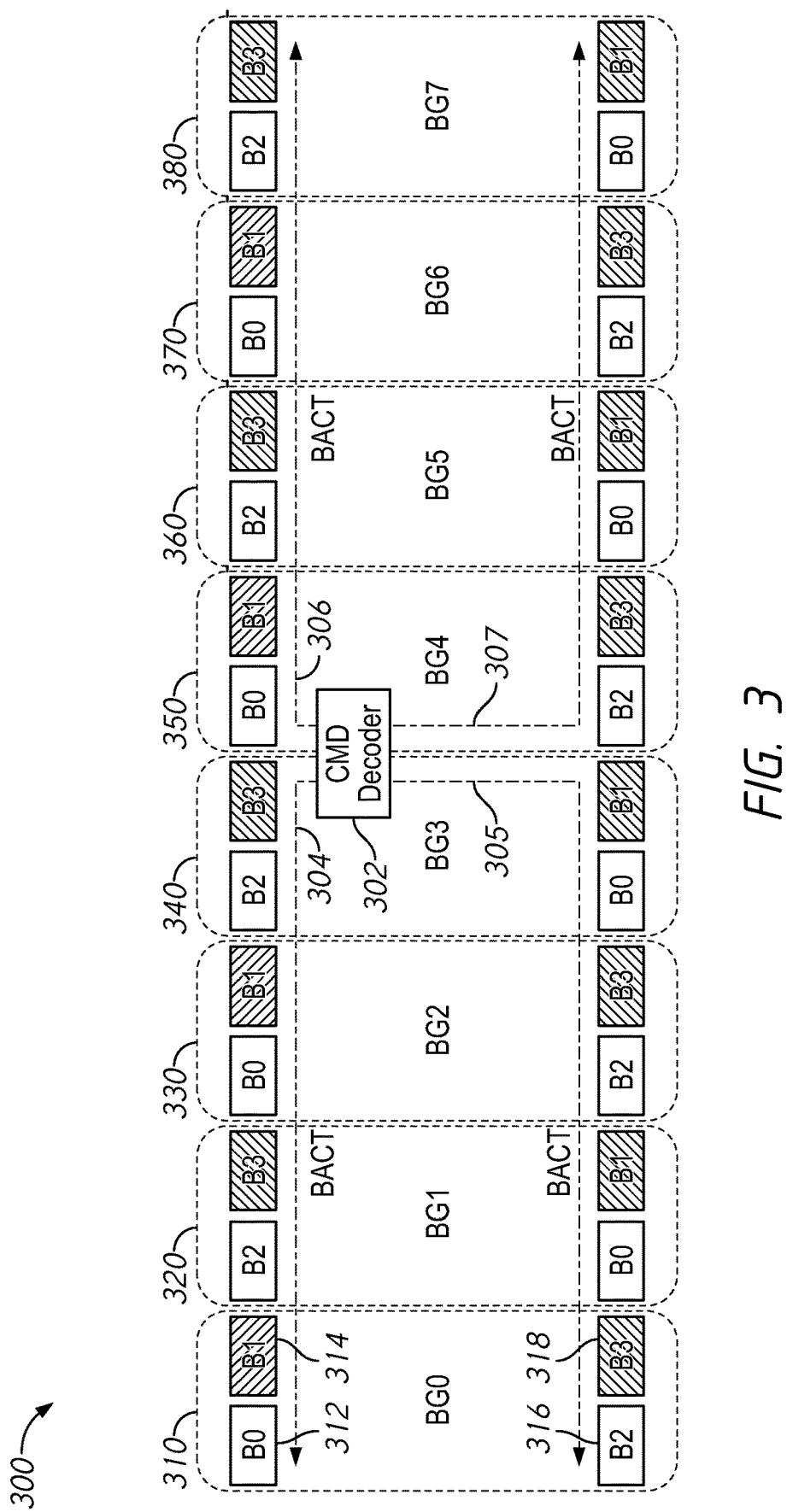
FIG. 3 is a block diagram of a layout of a memory according to some embodiments of the present disclosure.

FIG. 3 is a block diagram of a layout of a memory according to some embodiments of the present disclosure. The memory 300 shows an example layout of a memory, such as the memory 100 of FIGS. 1 and/or 220 of FIG. 2 in some embodiments. The memory 300 shows an example layout of how different banks may be arranged and how BACT signals may be distributed to those banks. Other example arrangements may be used in other embodiments.

The memory 300 shows a command decoder 302 (e.g., 106 of FIGS. 1 and/or 224 of FIG. 2) and 32 memory banks arranged in eight bank groups 310-380 of four banks each. The bank groups may be arranged in a line from bank group 0 (BG0) 310 to BG7 380. Each bank group includes two upper banks and two lower banks. For example BG0 310 includes upper banks B0 312 and B1 314 and lower banks B2 316 and B3 318.

The command decoder 302 may be positioned in a middle of the bank groups, for example between BG3 340 and BG4 350. The command decoder 302 provides a BACT signal for each bank, along a respective BACT signal line. The BACT signal lines may be arranged in groups. In the layout of FIG. 3, there are four BACT groups 304, 305, 306, and 307, for the upper and lower banks of the bank groups to the left and to the right of the command decoder 302. For example, BACT signal line group 304 includes the BACT signal lines for the upper banks of BG0 310 to BG3 340, BACT signal line group 305 includes the BACT signal lines for the lower banks of BG0 310 to BG3 340, BACT signal line group 306 includes the BACT signal lines for the upper banks of BG4 350 to BG7 380, and BACT signal line group 307 includes the BACT signal lines for the lower banks of BG4 350 to BG7 380.

Figure 4:
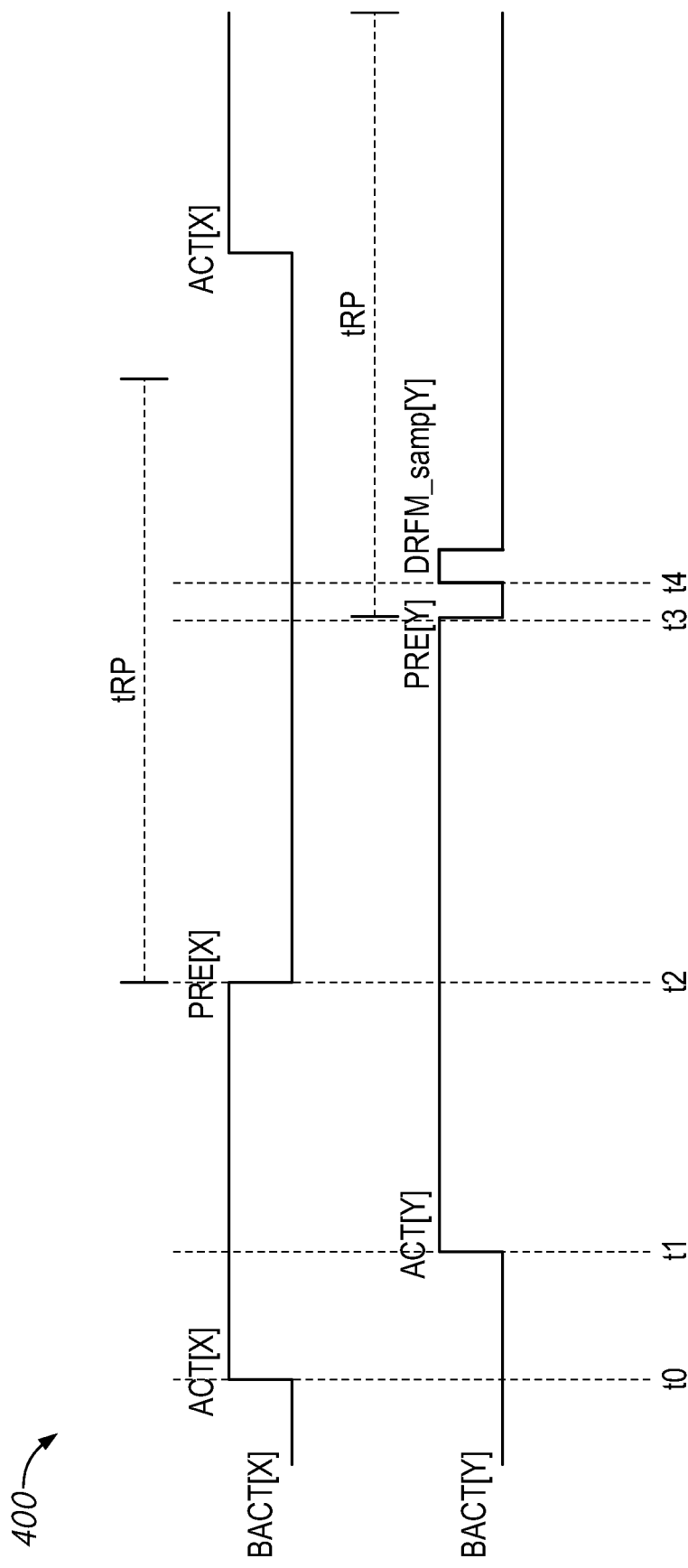
FIG. 4 is a timing diagram of bank activation signals according to some embodiments of the present disclosure.

FIG. 4 is a timing diagram of bank activation signals according to some embodiments of the present disclosure. The timing diagram 400 shows two signal traces, one for each of two different bank activation signals BACT associated with a respective bank. A signal BACT[X] for a bank X and a signal BACT[Y] for a bank Y. The signals BACT may be provided by a command decoder, such as the command decoder 106 of FIG. 1, 224 of FIG. 2, and/or 302 of FIG. 3.

Before an initial time t0, the two BACT signals are both inactive (e.g., at a low logical level). At the initial time, the signal BACT[X] becomes active (e.g., rises to a high logical level). The change of BACT[X] from inactive to active (e.g., the rising edge of BACT[X]) may act as an activate command ACT[X] for bank X. At a second time, the signal BACT[X] falls from the active level to the inactive level. The change of BACT[X] from active to inactive (e.g., the falling edge of BACT[X]) may act as a pre-charge command PRE[X] for bank X. Between ACT[X] and PRE[X] (e.g., between t0 and t2) an activate command (e.g., a read command, a write command, etc.) may be provided to bank X. After the time t2 (e.g., after the pre-charge command PRE[X]), a time tRP must elapse before a next ACT[X] command may be issued along BACT[X].

At a first time t1, the signal BACT[Y] becomes active, and the change of BACT[Y] from inactive to active (e.g., the rising edge of BACT[Y]) may act as an activation command ACT[Y] for bank Y. At a third time t3, BACT[Y] becomes inactive and the change of BACT[Y] from active to inactive (e.g., the falling edge of BACT[Y]) may act as a pre-charge command PRE[Y] for bank Y. Between ACT[Y] and PRE[Y] (e.g., between t1 and t3) commands such as read or write commands are issued to the bank Y. The time between ACT and PRE may be dependent on the commands issued, and thus, for example, the time between ACT[X] and PRE[X] (between t0 and t2) may be different than the time between ACT[Y] and PRE[Y] (between t1 and t3).

After the command PRE[Y] the time tRP must pass before a next ACT[Y] can be issued. Accordingly, other signals can be transmitted on BACT[Y], since the bank logic will not recognize those signals as an ACT until tRP has elapsed. At time t4, a DRFM sampling command DRFM_samp[Y] is issued to bank Y. The DRFM sampling command may be a pulse along the BACT[Y] signal line. Responsive to the DRFM sampling command DRFM_samp[Y], a DRFM latch (e.g., 236 of FIG. 2) of the bank Y may capture a current row address.

Figure 5:
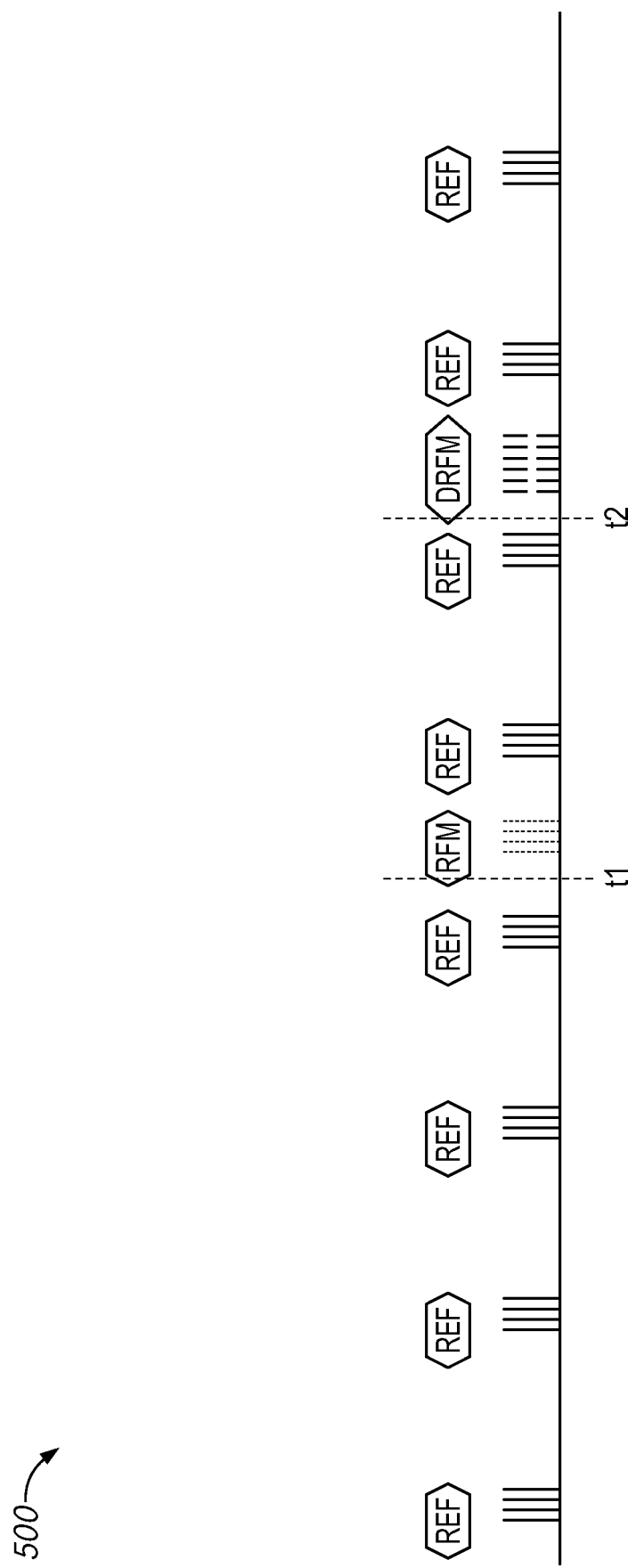
FIG. 5 is a timing chart of refresh signals and operations according to some embodiments of the present disclosure.

FIG. 5 is a timing chart of refresh signals and operations according to some embodiments of the present disclosure. The timing chart 500 shows example refresh signals received by an example refresh control circuit (e.g., 116 of FIG. 1 and 230 of FIG. 2) and pumps generated by the refresh control circuit in response to those signals. In the example embodiment of FIG. 5, each refresh signal REF is used to generate four pumps (e.g., four refresh operations). However more or fewer pumps per refresh signal may be used in other embodiments. In some embodiments, there may be different numbers of refresh pumps per refresh signal REF.

The timing chart 500 shows a set of refresh signals REF (e.g., AREF of FIG. 1) provided to the refresh control circuit. Responsive to each signal REF, the refresh control circuit generates four pumps (shown as a vertical line), and for each pump, provides a refresh address RXADD. The refresh addresses RXADD may be CAS before RAS (CBR) addresses or targeted refresh addresses. Each group of pumps (e.g., each set of four pumps produced responsive to a single REF signal) may include CBR addresses, targeted refresh addresses, or a mixture thereof. Responsive to the refresh command REF, the targeted refresh addresses are generated based on aggressors identified by the refresh control circuit (e.g., by aggressor detector circuit 232 of FIG. 2).

At a time t1, the refresh control circuit receives an RFM signal (e.g., responsive to an RFM command from a controller). Responsive to the RFM signal, the refresh control signal provides four pumps, each of which is associated with a targeted refresh address. The targeted refresh addresses provided responsive to the RFM signal may all be generated based on aggressors identified by the refresh control circuit (e.g., by aggressor detector circuit 232 of FIG. 2).

At a time t2, the refresh control circuit receives a DRFM signal, such as a DRFM service command (e.g., DRFM_serv of FIG. 2). Responsive to the DRFM service command, six pumps are provided, each associated with a targeted refresh address generated based on an aggressor identified by the controller (e.g., an address stored in a DRFM latch responsive to a DRFM sampling command). However, it should be understood that the six pumps are merely an example, and in other embodiments more or fewer pumps per DRFM service command may be provided. In some embodiments, the number of pumps per DRFM service command may be based on a setting of the memory, such as a mode register setting.

Figure 6:
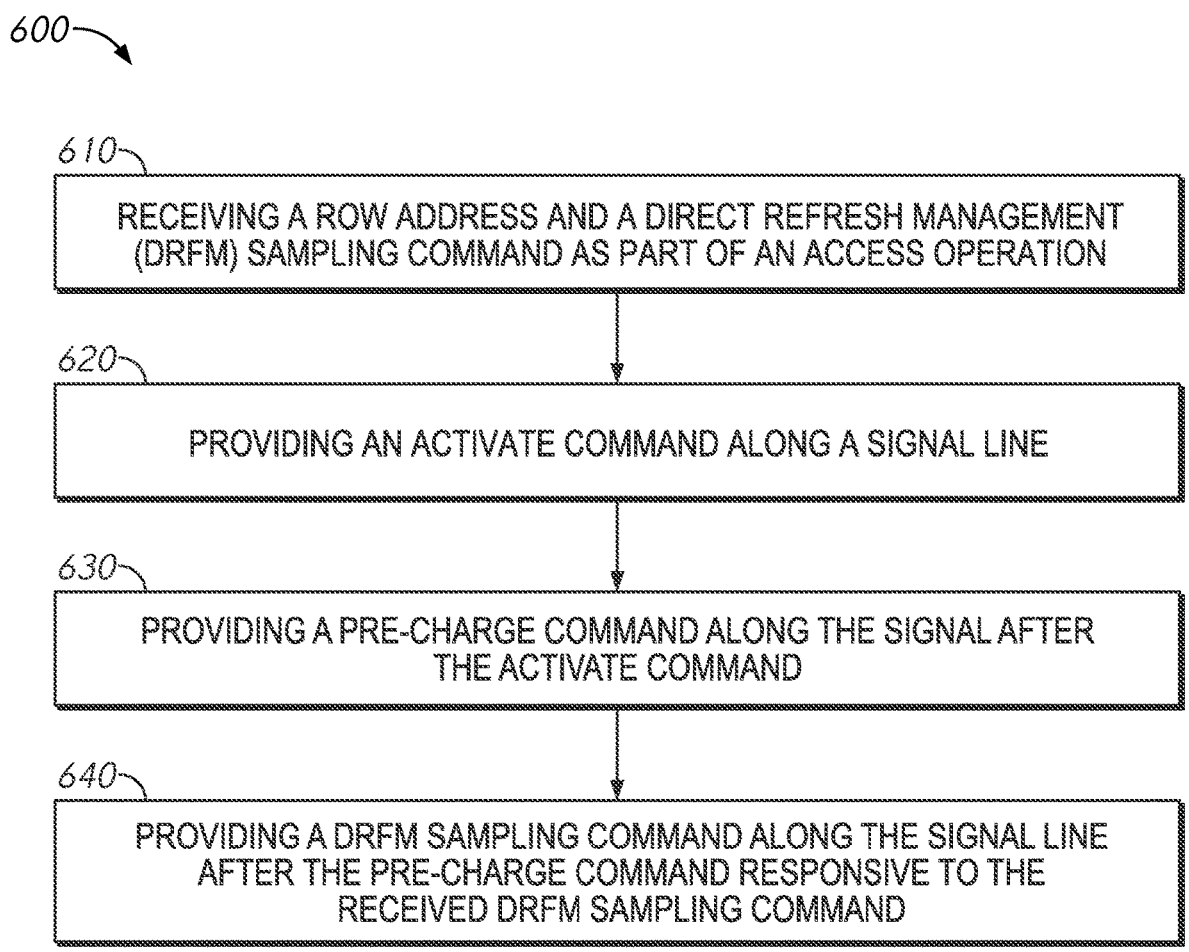
FIG. 6 is a flow chart of a method according to some embodiments of the present disclosure.

FIG. 6 is a flow chart of a method according to some embodiments of the present disclosure. The method 600 may, in some embodiments, be implemented by one or more of the apparatuses or systems described in FIGS. 1-3 and/or may use timing patterns described with respect to FIGS. 4-5.

The method 600 includes block 610, which describes receiving a row address and an direct refresh management (DRFM) sampling command as part of an access operation. For example, a memory device (e.g., 100 of FIG. 1) may receive commands at C/A terminals from a controller (e.g., 210 of FIG. 2). The method 600 may also include identifying the row address as an aggressor with row hammer logic of a controller and providing the DRFM sampling command responsive to that identification. The method 600 may also include receiving a bank address and activate command along with the row address. The method 600 may also include receiving an access command along with a column address and bank address. The method 600 may include receiving a pre-charge command or generating a pre-charge command responsive to an auto-pre-charge access command. The DRFM sampling command may be received along with the pre-charge command (or the auto-pre-charge access command). For example, a C/A pin may indicate if a DRFM sampling command is included with the pre-charge command (or auto-pre-charge access command). The row address and activate command may be received at a first time. The pre-charge command (or auto-pre-charge access command) and DRFM sampling command may be received at a second time after the first time.

The method 600 may continue with block 620, which describes providing an activate command along a signal line (e.g., responsive to the activate command and row address received from a controller). The method 600 may include a command decoder receiving the activate command and providing the activate command along a signal line to a bank specified by the bank address. The method 600 may include changing a signal along the signal line (e.g., a BACT signal along a BACT signal line) from an inactive to an active level to provide the activate command. The method 600 may include selecting the signal line from a plurality of signal lines based on the bank address. The method 600 may include activating a word line based on the activate signal and the row address.

The method 600 may continue with a block 630, which describes providing a pre-charge command along the signal line after the activate command. The command decoder may provide the pre-charge command a time after providing the activate command, responsive to the pre-charge command (or the auto-pre-charge access command). The method 600 may include changing the signal along the signal line (e.g., the BACT signal) from the active level to the inactive level to provide the pre-charge command. The method 600 may include de-activating (e.g., pre-charging) a word line based on the pre-charge command and the row address.

The method 600 may continue with block 640 which describes providing a DRFM sampling command along the signal line after the pre-charge command responsive to the received DRFM sampling command. For example, the command decoder may receive the DRFM sampling command and provide a pre-charge command along the signal line which was indicated by the bank address followed by providing the DRFM sampling command along the signal line. The DRFM sampling command may be providing by pulsing the signal along the signal line in some embodiments. The method 600 may include waiting at least a time tRP after providing the pre-charge command before a next activate command can be provided along the signal line. The method 600 may include providing the DRFM sampling command along the signal line during the time tRP.

The method 600 may include storing the row address in a DRFM latch (e.g., 236 of FIG. 2) responsive to the DRFM sampling command. The method may include providing a DRFM service command. For example, the command decoder may provide the DRFM service command responsive to receiving a DRFM service from the controller. The method 600 may include generating at least one refresh address based on the row address and refreshing one or more word lines associated with the at least one refresh address responsive to the DRFM service command. The method 600 may include determining a number of the at least one refresh address based on a mode register setting.

The method 600 may include identifying an aggressor address, for example with an aggressor detector circuit (e.g., 232 of FIG. 2), receiving a refresh management (RFM) command, and refreshing one more word lines based on the aggressor address responsive to the RFM command. The method 600 may include receiving a refresh signal and generating either an CBR address or a targeted refresh address, wherein the targeted refresh address is generated based on the identified aggressor address.

While in general the present disclosure refers to determining aggressor and victim wordlines and addresses, it should be understood that as used herein, an aggressor wordline does not necessarily need to cause data degradation in neighboring wordlines, and a victim wordline does not necessarily need to be subject to such degradation. The refresh control circuit may use some criteria to judge whether an address is an aggressor address, which may capture potential aggressor addresses rather than definitively determining which addresses are causing data degradation in nearby victims. For example, the refresh control circuit may determine potential aggressor addresses based on a pattern of accesses to the addresses and this criteria may include some addresses which are not aggressors, and miss some addresses which are. Similarly, victim addresses may be determined based on which wordlines are expected to be effected by aggressors, rather than a definitive determination of which wordlines are undergoing an increased rate of data decay.

As used herein, an activation of a signal may refer to any portion of a signals waveform that a circuit responds to. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level. One of skill in the art should understand that although embodiments may be described with respect to a particular type of activation used by a particular circuit (e.g., active high), other embodiments may use other types of activation (e.g., active low).

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    a signal line configured to carry a bank activation signal, wherein a rising edge of the bank activation signal represents an activate command, a falling edge indicates a pre-charge command, and a pulse after the pre-charge command but before the next activate command indicates a direct refresh management (DRFM) sampling command;
    a DRFM latch configured to store an address along an address bus responsive to the DRFM sampling command;
    a refresh address generator configured to generate a set of refresh addresses based on the stored address in the DRFM latch; and
    a row decoder configured to refresh word lines associated with the set of refresh addresses responsive to a DRFM service command.

2. The apparatus of claim 1, wherein a number of the set of refresh addresses is based on a mode register setting.

3. The apparatus of claim 1, wherein a relationship between the word lines associated with the set of refresh addresses and the stored address is based on a mode register setting.

4. The apparatus of claim 1, wherein there is at least a time tRP between the pre-charge command and a next activate command, and wherein the DRFM sampling command occurs within the time tRP.

5. The apparatus of claim 1, further comprising a plurality of memory banks, and wherein the signal line is associated with one of the plurality of memory banks.

6. The apparatus of claim 1, further comprising a command decoder configured to provide the DRFM sampling command responsive to receiving a DRFM sampling command from a controller and then provide the DRFM service command responsive to a DRFM sampling command from the controller.

7. The apparatus of claim 1, further comprising an aggressor detector circuit configured to identify an aggressor address, wherein responsive to a refresh management (RFM) command, the refresh address generator is configured to generate a set of refresh addresses based on the identified aggressor address.

8. An apparatus comprising:
    a command decoder configured to receive a row address and a direct refresh management (DRFM) sampling command from a controller as part of an access operation, wherein the command decoder is configured to provide an activate command and a pre-charge command to a bank responsive to the access operation and then provide the DRFM sampling command to the bank in a tRP period after the pre-charge command and before a next activate command; and
    a refresh control circuit configured to store the address responsive to the DRFM sampling command.

9. The apparatus of claim 8, wherein the refresh control circuit is further configured to refresh a set of word lines associated with the stored address responsive to a DRFM service command from the controller.

10. The apparatus of claim 9, wherein a number of the set of word lines and their relationship to the stored address are based on a mode register setting.

11. The apparatus of claim 8, wherein the command decoder is configured to provide the activate command, the pre-charge command, and the DRFM sampling command along a signal line to the bank.

12. The apparatus of claim 11, wherein the activate command is a rising edge of a signal along the signal line, the pre-charge command is a falling edge of the signal along the signal line, and the DRFM sampling command is a pulse of the signal along the signal line.

13. The apparatus of claim 8, wherein the refresh control circuit is further configured to identify an aggressor address, wherein the refresh control circuit is configured to refresh a second set of word lines associated with the aggressor address responsive to a refresh management (RFM) command.

14. The apparatus of claim 13, wherein the refresh control circuit is further configured to refresh the second set of word lines associated with the aggressor address responsive to a refresh signal.

15. A method comprising:
    receiving a row address, and an direct refresh management (DRFM) sampling command as part of an access operation;
    providing an activate command along a signal line;
    providing a pre-charge command along the signal after the activate command;
    providing the DRFM sampling command signal along the signal line after the pre-charge command responsive to the received DRFM sampling command.

16. The method of claim 15, further comprising storing the row address in a DRFM latch responsive to the DRFM sampling command.

17. The method of claim 15, further comprising:
   receiving a DRFM service command;
   generating at least one refresh address based on the row address; and
   refreshing one or more word lines associated with the at least one refresh address responsive to the DRFM service command.

18. The method of claim 17, further comprising determining a number of the at least one refresh address based on a mode register setting.

19. The method of claim 15, further comprising waiting at least a time tRP after the pre-charge command before issuing a next activate command, wherein the DRFM sampling command is issued during the time tRP.

20. The method of claim 15, further comprising:
   identifying an aggressor address;
   receiving a refresh management (RFM) command;
   refreshing one more word lines based on the aggressor address responsive to the RFM command.

* * * * *